(12) United States Patent
Sano et al.

(10) Patent No.: US 9,798,239 B2
(45) Date of Patent: Oct. 24, 2017

(54) FLOW THROUGH MEMS PACKAGE

(71) Applicant: Silicon Light Machines Corporation, Sunnyvale, CA (US)

(72) Inventors: Kenichi Sano, Nagaoka Kyo (JP); Lars Eng, Los Altos, CA (US); Alexander Payne, Ben Lomond, CA (US); James Hunter, Campbell, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 0 days.

(21) Appl. No.: 14/308,627

(22) Filed: Jun. 18, 2014

(65) Prior Publication Data

US 2014/0300880 A1    Oct. 9, 2014

Related U.S. Application Data

(63) Continuation of application No. 13/153,127, filed on Jun. 3, 2011, now Pat. No. 8,767,170.

(51) Int. Cl.
   *G03F 7/20* (2006.01)
   *G02B 26/08* (2006.01)
   *B81B 7/00* (2006.01)

(52) U.S. Cl.
   CPC .......... *G03F 7/2051* (2013.01); *B81B 7/0041* (2013.01); *B81B 7/0061* (2013.01); *G02B 26/0808* (2013.01); *G02B 26/0841* (2013.01); *G03F 7/70291* (2013.01); *G03F 7/70866* (2013.01); *G03F 7/70916* (2013.01); *G03F 7/70933* (2013.01)

(58) Field of Classification Search
   CPC .................................................. G03F 7/70291
   See application file for complete search history.

(56) References Cited

U.S. PATENT DOCUMENTS

| | | | |
|---|---|---|---|
| 6,555,834 B1 * | 4/2003 | Loopstra | G03F 7/70716 |
| | | | 250/492.22 |
| 6,746,886 B2 | 6/2004 | Duncan et al. | |
| 7,159,464 B2 | 1/2007 | Tohyama et al. | |
| 7,393,712 B2 | 7/2008 | Smith et al. | |
| 7,489,837 B2 | 2/2009 | Ravnkilde et al. | |
| 7,530,826 B2 | 5/2009 | Zeigler | |
| 7,580,599 B2 | 8/2009 | Aota et al. | |
| 7,610,803 B2 | 11/2009 | Ricks | |
| 7,795,063 B2 | 9/2010 | Hsieh et al. | |
| 7,903,408 B1 | 3/2011 | Yu | |
| 8,052,289 B2 | 11/2011 | Ravensbergen et al. | |
| 2002/0057425 A1 | 5/2002 | Nakano | |
| 2002/0075551 A1 | 6/2002 | Daneman et al. | |

(Continued)

*Primary Examiner* — Steven H Whitesell Gordon
(74) *Attorney, Agent, or Firm* — William Nuttle (57) ABSTRACT

A flow through Micro-Electromechanical Systems (MEMS) package and methods of operating a MEMS packaged using the same are provided. Generally, the package includes a cavity in which the MEMS is enclosed, an inlet through which a fluid is introduced to the cavity during operation of the MEMS and an outlet through which the fluid is removed during operation of the MEMS, wherein the package includes features that promote laminar flow of the fluid across the MEMS. The package and method are particularly useful in packaging spatial light modulators including a reflective surface and adapted to reflect and modulate a light beam incident thereon. Other embodiments are also provided.

17 Claims, 7 Drawing Sheets

(56) References Cited

U.S. PATENT DOCUMENTS

| | | |
|---|---|---|
| 2002/0085183 A1 | 7/2002 | Wu et al. |
| 2002/0192579 A1 | 12/2002 | Kamono |
| 2003/0150329 A1 | 8/2003 | Kamono |
| 2004/0239908 A1 | 12/2004 | Bleeker et al. |
| 2005/0046819 A1 | 3/2005 | Bleeker et al. |
| 2005/0134819 A1 | 6/2005 | de Jager |
| 2006/0049826 A1 | 3/2006 | Daneman et al. |
| 2006/0104413 A1* | 5/2006 | Ohmi .................. G03F 7/70291 378/35 |
| 2007/0241417 A1 | 10/2007 | Hubbers et al. |
| 2008/0248613 A1 | 10/2008 | Chen et al. |
| 2010/0165314 A1 | 7/2010 | Duncan et al. |

* cited by examiner

FLOW THROUGH MEMS PACKAGE

CROSS-REFERENCE TO RELATED APPLICATIONS

This application claims priority to and benefit of U.S. Application Ser. No. 13/153,127, filed on Jun. 3, 2011, now U.S. Pat. No. 8,767,170 which is incorporated by reference herein in its entirety.

TECHNICAL FIELD

The present invention relates generally to Micro-Electromechanical Systems (MEMS), and more particularly to flow through MEMS packages and methods of operating a MEMS packaged in a flow through MEMS package.

BACKGROUND

Micro-Electromechanical Systems (MEMS), also referred to as micromachines, are very small, electrically driven mechanical devices fabricated using semiconductor device or integrated circuit (IC) manufacturing technologies. One particularly useful type of MEMS is a reflective spatial light modulator (SLM) that uses electrical signals to move micromechanical structures to modulate light incident thereon. The incident light can be modulated in intensity, phase, polarization or direction. MEMS spatial light modulators are increasingly being developed for use in various applications, including display systems, optical information processing and data storage, printing, and maskless lithography. In a maskless lithography system, a mask and/or reticle is replaced by a dynamic direct writing process using a high power light source, such as a laser, and spatial light modulators. Maskless lithography speeds up IC design cycle times and reduce cost, particularly with respect to design changes, which would previously require one or more new masks to be made for each design revision. Similar systems may also be used in patterning masks.

One problem with conventionally packaged MEMS spatial light modulators in general, and those used in maskless lithography systems in particular, is that the high power lasers used can volatilize contaminates and materials in the MEMS package, which can build up on surfaces of the SLM, reducing the reflectivity and operating life of the SLM. Heretofore attempts to address these problems have focused on thoroughly evacuating and hermetically sealing the MEMS package in which the SLM is contained. However, this approach has not been satisfactory.

SUMMARY

The following is a summary of embodiments of the invention in order to provide a basic understanding of some aspects. This summary is not intended to identify key/critical elements of the embodiments or to delineate the scope of the embodiments. Its sole purpose is to present some concepts in a simplified form as a prelude to the more detailed description that is presented later.

In one example, a flow through Micro-Electromechanical Systems (MEMS) package and methods of operating a MEMS packaged using the same are provided. Generally, the package includes a cavity in which the MEMS is enclosed, an inlet through which a fluid is introduced to the cavity during operation of the MEMS and an outlet through which the fluid is removed during operation of the MEMS. In certain embodiments, the fluid includes a gas, such as a nitrogen, and the inlet and outlet are adapted to provide a flow of gas of from 0.01 Standard Cubic Centimeters per Minute (sccm) to 10000 sccm during operation of the MEMS. The package and method are particularly useful in packaging spatial light modulators including a reflective surface and adapted to reflect and modulate a light beam incident thereon.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to a flow through Micro-Electromechanical Systems (MEMS) packages and to methods of operating a MEMS packaged in a flow through MEMS package.

A MEMS spatial light modulator (SLM) for which a flow through MEMS package according to the present invention is particularly useful will now be described with reference to FIGS. 1A through 1C. For purposes of clarity, many of the details of MEMS in general and MEMS spatial light modulators in particular that are widely known and are not relevant to the present invention have been omitted from the following description. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

In many MEMS based spatial light modulators, electrostatic actuation is used to move micromechanical structures. For example, one type of MEMS spatial light modulator that uses electrostatic actuation is a ribbon-type SLM, such as a Grating Light Valve (GLV™) commercially available from Silicon Light Machines, Inc., of Sunnyvale, Calif. Referring to FIGS. 1A and 1B, a ribbon-type SLM 100 generally includes a number of ribbons 102a, 102b; each having a light reflective surface 104 supported over a surface 106 of a substrate 108. One or more of the ribbons 102a are movable or deflectable through a gap or cavity 110 toward the substrate 108 to form an addressable diffraction grating with adjustable diffraction strength. The ribbons are 102a deflected towards the surface 106 of the substrate 108 by electrostatic forces generated when a voltage is applied between electrodes 112 in the deflectable ribbons 102a and base electrodes 114 formed in or on the substrate. The applied voltages are controlled by drive electronics (not shown in these figures), which may be integrally formed in or on the surface 106 of the substrate 108 below or adjacent to the ribbons 102. Light reflected from the movable ribbons 102a adds as vectors of magnitude and phase with that reflected from stationary ribbons 102b or a reflective portion of the surface 106 beneath the ribbons, thereby modulating light reflected from the SLM 100.

Figure 1A:
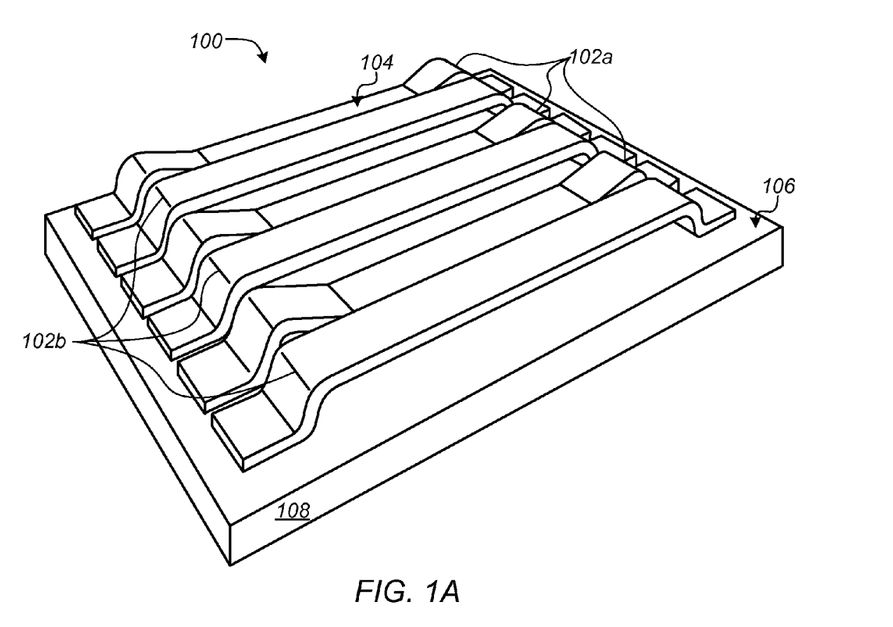
FIG. 1A is a perspective view of an embodiment of a Micro-Electromechanical Systems (MEMS) spatial light modulator (SLM) for which a flow through MEMS package is particularly useful.
Figure 1B:
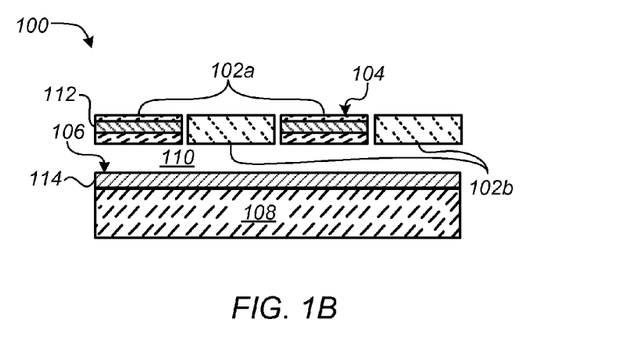
FIG. 1B is a schematic block diagram of a sectional side view of the SLM of FIG. 1A.
Figure 1C:
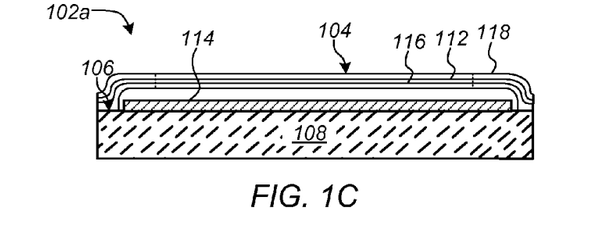
FIG. 1C is a schematic block diagram of a sectional side view of the SLM of FIG. 1A.

A schematic sectional side view of a movable structure or ribbon 102a of the SLM 100 of FIG. 1A taken along a longitudinal axis is shown in FIG. 1C. Referring to FIG. 1C, the ribbon 102a includes an elastic mechanical layer 116 to support the ribbon above the surface 106 of the substrate 108, an electrode or conducting layer 112 and a reflective surface 104 overlying the mechanical layer and conducting layer. In certain embodiments, such as that shown in FIG. 1C, the reflective surface 104 can be formed on a separate reflective layer 118 discrete from and overlying the mechanical layer 116 and the conducting layer 112.

Generally, the mechanical layer 116 comprises a taut silicon-nitride film (SiNx), and flexibly supported above the surface 106 of the substrate 108 by a number of posts or structures, typically also made of SiNx, at both ends of the ribbon 102a. The conducting layer 112 can be formed over and in direct physical contact with the mechanical layer 116, as shown, or underneath the mechanical layer. The conducting layer 112 or ribbon electrode can include any suitable conducting or semiconducting material compatible with standard MEMS fabrication technologies. For example, the conducting layer 112 can include an amorphous or poly-crystalline silicon (poly) layer, or a titanium-nitride (TiN) layer. Alternatively, if the reflective layer 118 is above the conductive layer 112, the conductive layer could also be metallic.

The separate, discrete reflecting layer 118, where included, can include any suitable metallic, dielectric or semiconducting material compatible with standard MEMS fabrication technologies, and capable of being patterned using standard lithographic techniques to form the reflective surface 104.

Figure 2:
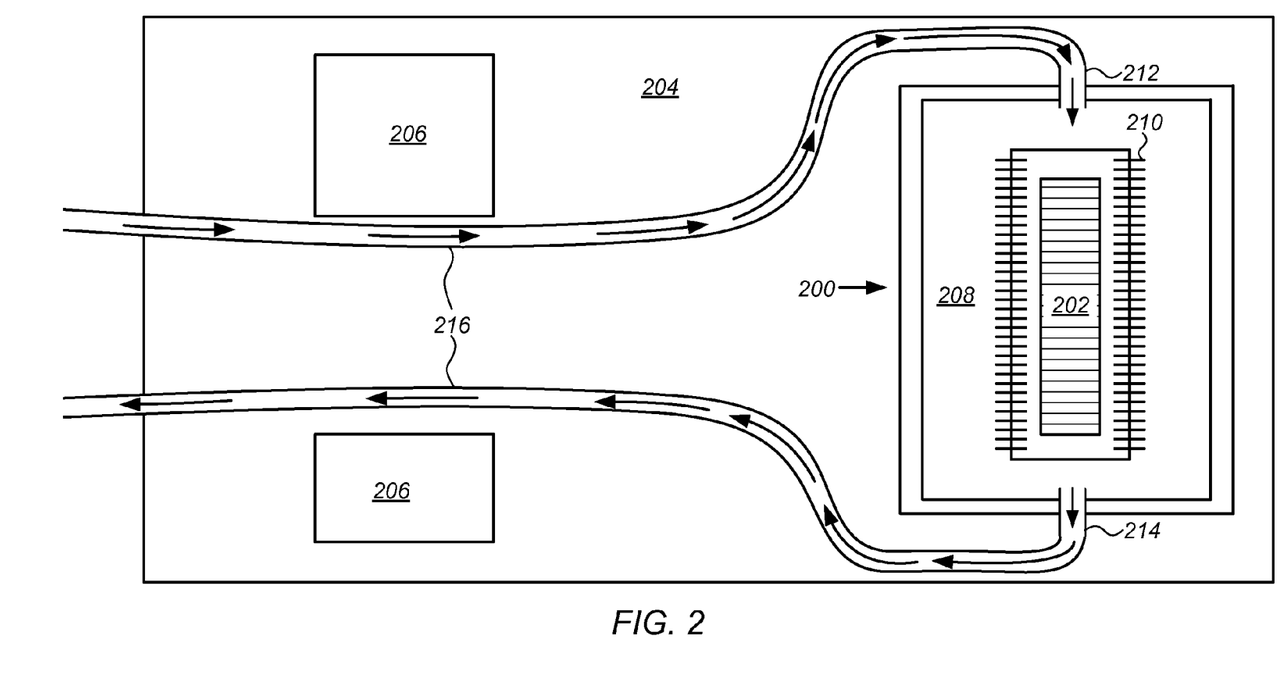
FIG. 2 is a schematic block diagram of a plan view of an embodiment of a flow through MEMS package on a circuit board.

FIG. 2 is a schematic block diagram of a plan view of an embodiment of a flow through MEMS package 200 enclosing a MEMS 202, such as the MEMS SLM described above, and mounted on a circuit board 204, such as a printed circuit board or PCB. The circuit board 204 may further include a number of electronic elements or integrated circuits (ICs 206) mounted thereto, which are electrically coupled to the MEMS 202 through traces and leads or ball or pin grid arrays to receive signals from or to operate or drive the MEMS.

Referring to FIG. 2, the flow through MEMS package 200 generally includes a cavity 208 in which the MEMS 202 is enclosed, an optically transparent cover (not shown in this figure), wire bonds 210 to electrically couple the MEMS to the MEMS package, an inlet 212 extending through a sidewall of the MEMS package by means of which a fluid flows into the cavity, and an outlet 214 through the sidewall opposite the inlet, through which the fluid is exhausted or removed.

Tubing 216 coupled to the inlet 212 and outlet 214 supplies fluid from a fluid source (not shown in this figure) to the inlet and, optionally, exhausts fluid from the outlet to location some distance from the MEMS package 200. This embodiment is particularly advantageous when the packaged MEMS is operated in a controlled environment such as a wafer fabrication laboratory or clean room.

The fluid flowed through the MEMS package 200 can be any suitable liquid or gas of sufficient purity that is compatible with materials of the MEMS 202 and MEMS package and having any necessary dielectric or optical properties. For example, where the MEMS is a MEMS SLM similar to that described above with reference to FIGS. 1A-1C, the fluid can include a substantially optically transparent gas, such as air, nitrogen ($N_2$) or Argon. Alternatively or optionally, the fluid can include a reactive gas, such as oxygen ($O_2$) or ozone ($O_3$) gas selected to remove specific impurities. In certain, embodiments, fluid including a reactive gas can be flowed through the cavity 208 prior to operating the MEMS 202 or during a regularly scheduled maintenance mode to clean contaminates off of the surface of the MEMS.

An embodiment of a flow through MEMS package suitable for use with MEMS spatial light modulators, such as that described above will now be described in greater detail with reference to FIGS. 3A and 3B.

Figure 3A:
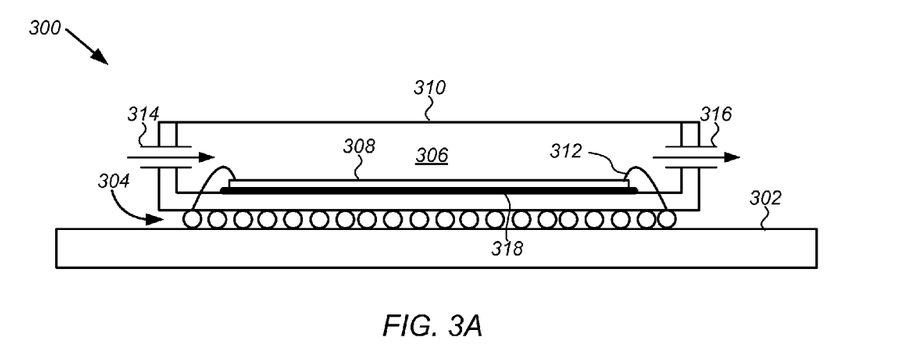
FIG. 3A is a schematic block diagram of a sectional side view of an embodiment of a flow through MEMS package.

FIG. 3A is a sectional side view of an embodiment of a flow through MEMS package 300. Referring to FIG. 3A, in the embodiment shown the MEMS package 300 is a surface-mount, no lead type of packaging, mechanically and electrically coupled to a circuit board 302 through a ball grid array (BGA 304) or pin grid array (PGA) (not shown). The package includes a cavity 306 in which a MEMS spatial light modulator 308 is enclosed, an optically transparent cover 310 through which a reflective surface the MEMS SLM is exposed, and wire bonds 312 to electrically couple the MEMS SLM to the BGA 304. The MEMS spatial light modulator 308 is attached to the MEMS package 300 by a thin layer of solder 318. The MEMS package 300 further includes an inlet 314 extending through a sidewall 320 of the MEMS package by means of which a fluid flows into the cavity 306, and an outlet 316 through the sidewall opposite the inlet, through which the fluid is exhausted or removed.

Figure 3B:
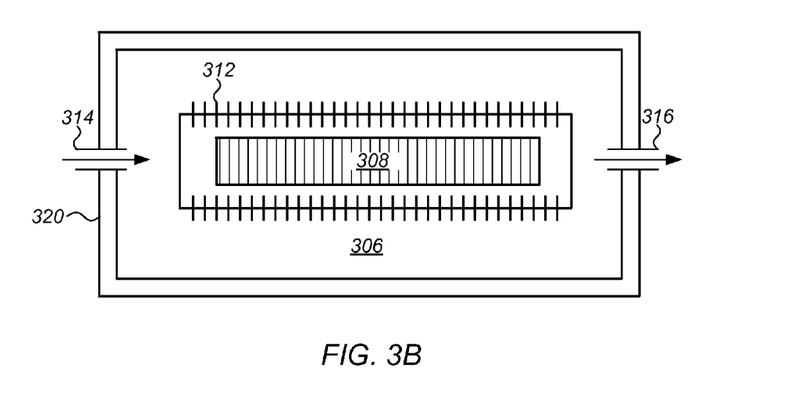
FIG. 3B is a schematic block diagram of a plan view of the MEMS package of FIG. 3A.

FIG. 3B is a plan or top view of the MEMS package 300 of FIG. 3A. Referring to FIG. 3B it is noted that the inlet 314 and outlet 316 are axially aligned with one another and with a long axis of the MEMS spatial light modulator 308 to maximize flow across reflective surfaces of the MEMS spatial light modulator, and thereby minimize or substantially eliminate reflectivity reducing deposits on the reflective surfaces.

Alternative embodiments of a flow through MEMS package will now be described with reference to FIGS. 4A-4C.

Figure 4A:
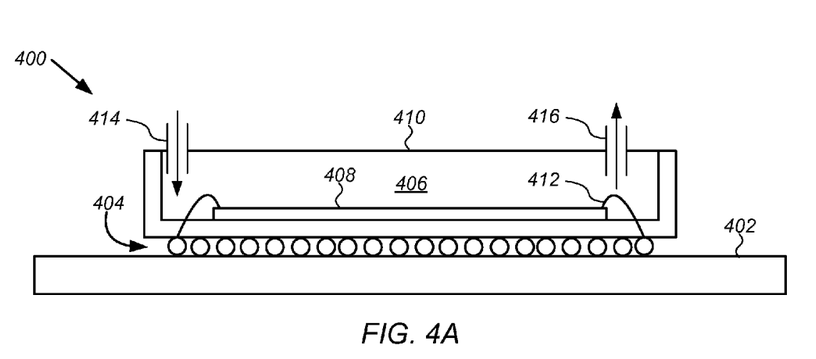
FIGS. 4A through 4C are schematic block diagrams of other embodiments of a flow through MEMS package.

Referring to FIG. 4A, in a first alternative embodiment the MEMS package 400 is a surface-mount, no lead type of packaging, mechanically and electrically coupled to a circuit board 402 through a ball grid array (BGA 404). The package includes a cavity 406 in which a MEMS spatial light modulator 408 is enclosed, an optically transparent cover 410 through which a reflective surface the MEMS SLM is exposed, and wire bonds 412 to electrically couple the MEMS SLM to the BGA 404. The MEMS package 400 further includes an inlet 414 through the cover 410 by means of which a fluid is introduced to the cavity 406 and an outlet 416 by which the fluid is exhausted or removed.

Figure 4B:
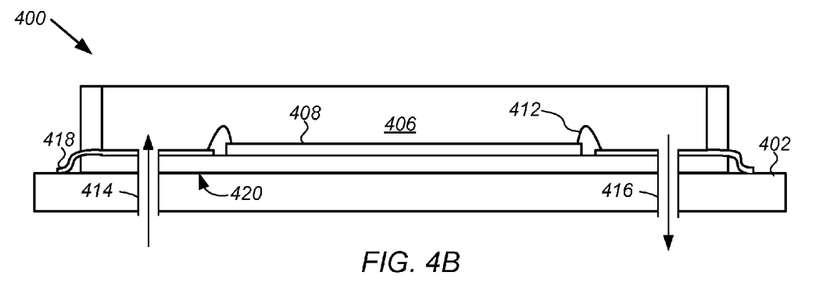

In another alternative embodiment, shown in FIG. 4B, the MEMS package 400 mechanically and electrically coupled to a circuit board 402 through leads 418 or pins extending through sides of the MEMS package. As with the embodiment of FIG. 4A, the MEMS package further includes a cavity 406 in which a MEMS spatial light modulator 408 is enclosed, an optically transparent cover 410 through which a reflective surface the MEMS SLM is exposed, and wire bonds 412 to electrically couple the MEMS SLM to the leads 418. However, in this second alternative embodiment, the inlet 414 and the outlet 416 extend through a lower surface 420 of the MEMS package and the circuit board 402 to provide a fluid flow in the cavity 406.

Figure 4C:
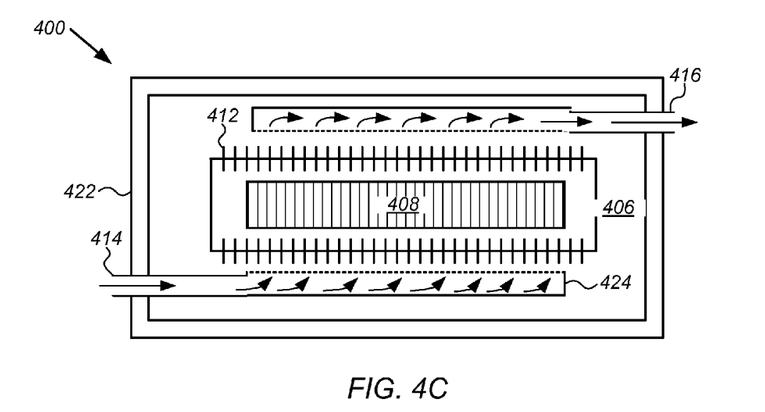

In other alternative embodiments, illustrated in FIG. 4C, the inlet 414 and the outlet 416 extend through sidewalls 422 of the MEMS package 400, as with the embodiments described above with respect to FIGS. 3A and 3B, however the inlet and outlet are axially offset from one another. In still another embodiment illustrated in FIG. 4C, the package can includes features, such as vanes or diffusers 424, to diffuse or direct fluid flow and promote a laminar flow of fluid across the MEMS 402.

Figure 5:
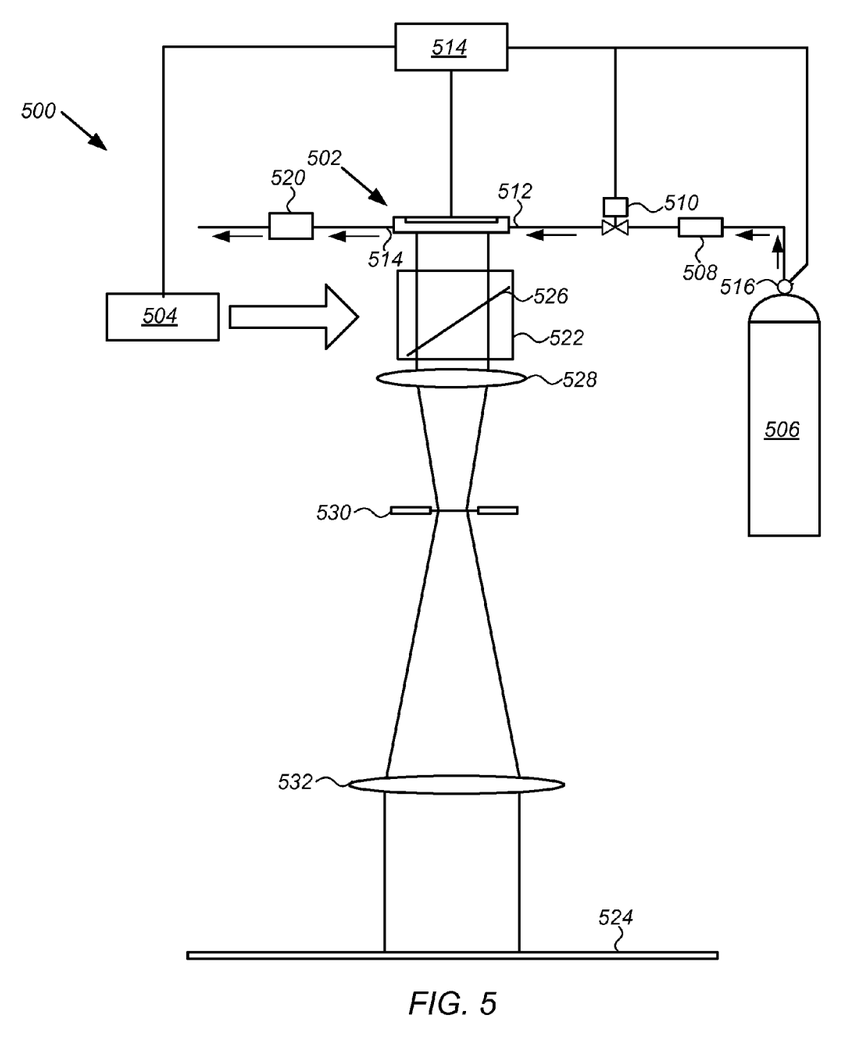
FIG. 5 is a schematic block diagram of an embodiment of a maskless lithographic system including a MEMS SLM packaged in a flow through MEMS package.

A maskless lithographic system including a MEMS SLM for which a flow through MEMS package according to the present invention is particularly useful will now be described with reference to FIG. 5. FIG. 5 is a schematic block diagram of a lithographic system 500 including a MEMS assembly 502, a light source 504, imaging optics and illumination optics. By MEMS assembly 502 it is meant a MEMS SLM packaged in a flow through MEMS package such as one of the embodiments described above with respect to FIGS. 2 through 4C. In accordance with the present invention the lithographic system 500 further includes a fluid source 506, such as a cylinder or Dewar containing a gas, one or more in-line chemical and/or particle filters 508 to purify the fluid, a flow controller and/or monitor, such as a mass flow controller (MFC 510) to control and/or monitor the flow of fluid to an inlet 512 of the MEMS package, and a controller 514 to control operation of the MFC.

In one embodiment, such as that shown, the controller 514 also provides voltages to drive the MEMS SLM and controls operation of the light source 504, thereby ensuring fluid flow is established before exposing the MEMS SLM to illumination from the light source, and stopping the illumination should the fluid flow drop below a specified minimum. For example, the controller 514 can be configured to automatically stop exposure of the reflective surface to the illumination if the fluid flow drops below a specified minimum as indicated by the MFC 510. The lithographic system 500 can further include a pressure monitor 516 on the fluid source 506, and the controller 514 can be configured to automatically stop exposure of the reflective surface if the pressure of the fluid source drops below a specified minimum.

The lithographic system 500 further includes an outlet 518 through which the fluid is removed or exhausted from the MEMS package. Although not shown, it will be understood that the outlet 518 can be coupled to a length of tubing sufficient to exhaust the fluid outside of a clean room or wafer fabrication facility in which the lithographic system 500 is operated. Alternatively or additionally, the lithographic system 500 can further include an in-situ monitor 520, such as a gas spectrum analyzer, to monitor contamination of fluid flowing through the cavity, and the controller 514 can be configured to automatically stop exposure of the reflective surface if a level of contamination is above a specified level. For example, greater than 1 nanogram per liter (ng/L) carbon, silicon or oxides.

Generally, the illumination optics include a number of elements including lenses, mirrors and prisms, designed to transfer a light beam from the light source 504, such as an Ultra Violet laser, to the MEMS assembly 502 to illuminate an area substantially equal to that of the reflective surface of the MEMS SLM. In the embodiment shown, the illumination optics include a polarizing beam splitter (PBS) 522, which reflects light having a first polarization onto the MEMS assembly 502, and transmits the light having a second polarization from the MEMS assembly towards a target wafer or substrate 524 through the imaging optics. For example, the PBS 522 can be adapted to reflect light having a Transverse-Electric (TE) polarization towards the MEMS assembly 502, and to transmit light having a Transverse-Magnetic (TM) polarization toward the target substrate 524. The light that is initially directed toward the MEMS assembly 502 by the PBS 522 in the TE state will pass twice through a quarter-wave plate (QWP) 526, thus converting it to TM polarization and allowing to pass through the PBS and on to the imaging optics that follow.

As shown, the imaging optics can include magnification and filtering elements, such as a first Fourier Transform (FT) lens 528 to focus and direct light from the MEMS assembly 502 onto a FT filter, a FT filter 530 to select the 0th order modulated light, and a second, larger Inverse FT lens 532 to enlarge the image generated by MEMS assembly and project it onto the target substrate 524.

Figure 6:
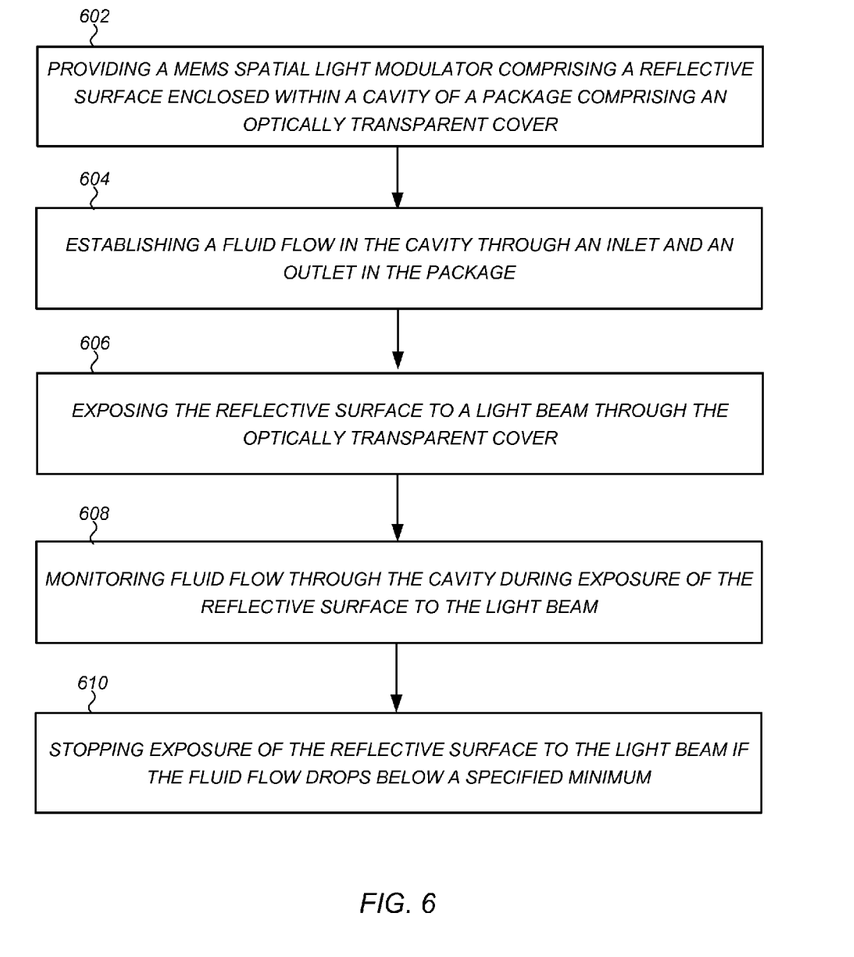
FIG. 6 is a flow chart illustrating an embodiment of a method for operating a MEMS SLM packaged in a flow through MEMS package.

A method for operating a MEMS SLM packaged in a flow through MEMS package will now be described with reference to the flow chart of FIG. 6. Referring to FIG. 6, the method begins with enclosing or providing a MEMS SLM enclosed within a cavity of a package including an optically transparent cover through which a reflective surface of the spatial light modulator is exposed. (step 602) Next, a fluid flow is established in the cavity through an inlet and an outlet in the package. (step 604) As noted above, the fluid is generally an optically transparent fluid or a gas, such as nitrogen ($N_2$). The inlet and outlet are adapted to provide a flow of gas of from about 0.01 Standard Cubic Centimeters per Minute (sccm) to about 10000 sccm. After establishing fluid flow in the cavity, the reflective surface is exposed to a light beam. (step 606) In certain embodiments, the light beam is a high intensity light beam, such as that generated by a laser. Fluid flow through the cavity is monitored during exposure of the reflective surface to the light beam, step 608, and exposure of the reflective surface to the light beam stopped if the fluid flow drops below a specified minimum. (step 610) For example, exposure of the reflective surface to the light beam stopped if the fluid flow drops below a flow of less than 0.01 sccm as indicated by a mass flow controller. Alternatively or additionally, monitoring fluid flow can include monitoring pressure of a fluid source, and stopping exposure of the reflective surface to the light beam if the pressure of the fluid source drops below a specified minimum.

Optionally, where the system includes an in-situ monitor, such as a spectrum gas analyzer, for monitoring contamination of fluid flowing through the cavity, the method can further include monitoring the concentration of contaminates in the effluent during exposure of the reflective surface to the light beam using an in-situ monitor, and stopping exposure of the reflective surface to the light beam if the contamination is above a specified level.

Figure 7:
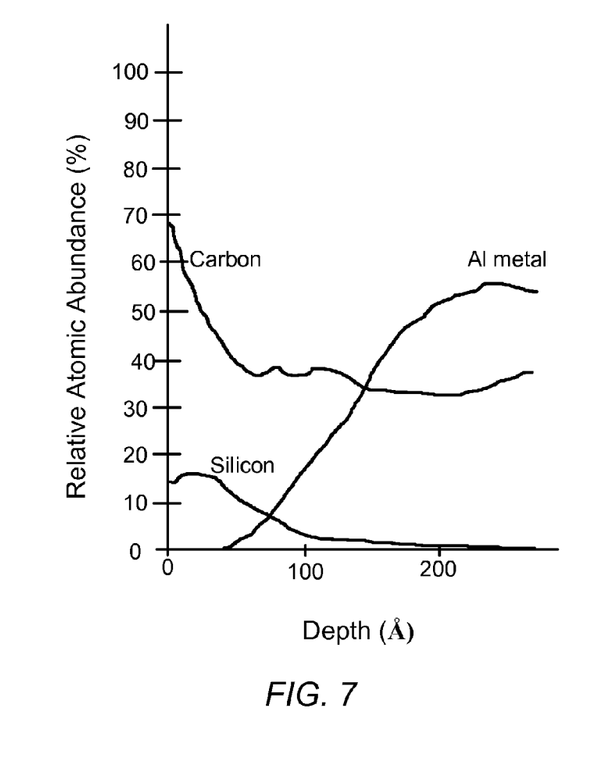
FIGS. 7 and 8 are graphs comparing build-up of reflection reducing deposits on a conventionally packaged and operated reflective SLM as compared to a SLM packaged in a flow through package and operated according to the present invention.
Figure 8:
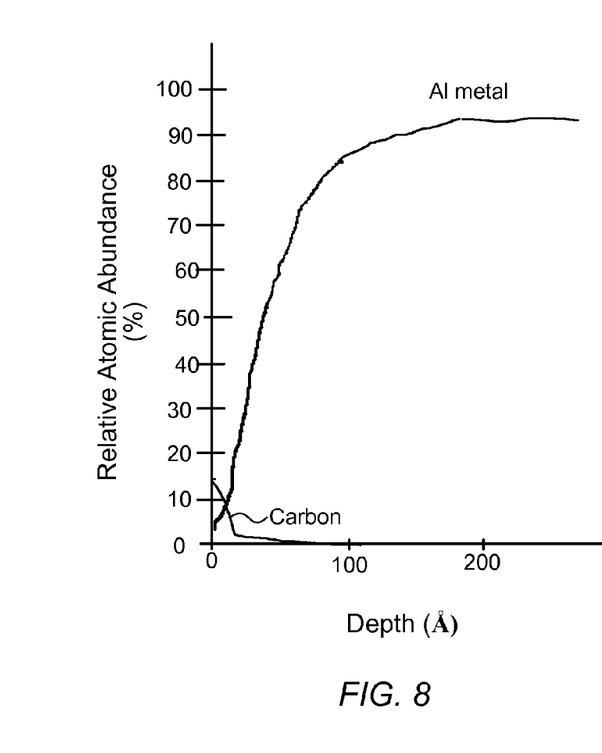

A comparison of reflectivity reducing deposits on reflective surfaces of a MEMS SLM packaged using a flow through MEMS package according to an embodiment of the present invention as compared to a MEMS SLM packaged using a conventional hermetically sealed will now be made with reference to FIGS. 7 and 8. FIGS. 7 and 8 are graphs of the relative atomic abundance of deposits on a reflective surface versus depth in angstroms (Å) following extended, intermittent operation of a packaged MEMS SLM illuminated by an ultra violet laser at a power of from about 1 W/cm$^2$ to about 100 kW/cm$^2$ In particular, FIG. 7 illustrates the relative atomic abundance of deposits on an aluminum metal reflective surface of a conventionally packaged MEMS SLM following 100 hours of operation, at which time reflectivity reducing deposits had rendered performance of the MEMS SLM unsatisfactory. Referring to FIG. 7, there is a very thick carbon contamination with a relative atomic abundance of 70% at a top of the reflective surface gradually falling to an abundance of 40% at a depth of about 200 Å. Significant silicon deposition was also found having a peak abundance of about 17% at a depth of about 20 Å.

FIG. 8 illustrates the relative atomic abundance of deposits on an aluminum metal reflective surface of a MEMS SLM packaged using a flow through MEMS package and operated according to an embodiment of the present invention. In particular, the MEMS SLM from which the graph of FIG. 8 is derived was intermittently operated intermittent illuminated by an ultra violet laser at a power density of about 1 kW/cm$^2$ for a total of 100 hours of operation, while nitrogen gas ($N_2$) was flowed continuously through the MEMS package cavity at a flow rate of about 3 sccm, while the reflective surface was illuminated. Referring to FIG. 8, it is noted that there was found a very low carbon contamination with a relative atomic abundance of less than about 15% at the top of the reflective surface which quickly falls to an undetectable level at a depth of about 10 Å. No significant silicon deposition was found.

Thus, embodiments of a flow through MEMS package and methods of operating a MEMS packaged using the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

In the forgoing description, for purposes of explanation, numerous specific details have been set forth in order to provide a thorough understanding of the control system and method of the present disclosure. It will be evident however to one skilled in the art that the present MEMS package and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the control system or method. The appearances of the phrase "one embodiment" in various places in the specification do not necessarily all refer to the same embodiment. The term "to couple" as used herein may include both to directly electrically connect two or more components or elements and to indirectly connect through one or more intervening components.

What is claimed is:

1. A method comprising:
   providing a Micro-Electromechanical System (MEMS) enclosed within a cavity of a package;
   introducing fluid from a fluid source into the cavity through an inlet in the package and removing the fluid through an outlet in the package;
   monitoring fluid flow through the cavity while operating the MEMS; and
   stopping operation of the MEMS if the fluid flow drops below a specified minimum,
   wherein the package contains features that promote laminar flow of fluid across the MEMS.

2. The method of claim 1, further comprising:
   monitoring contamination of fluid flowing through the cavity during operation of the MEMS; and
   stopping operation of the MEMS if the contamination is above a specified level.

3. The method of claim 1, wherein the fluid comprises a gas, and further comprising purifying the gas with a filter prior to introducing the gas into the cavity.

4. The method of claim 1, wherein the fluid comprises a reactive gas.

5. The method of claim 4, wherein the reactive gas comprises oxygen ($O_2$) or ozone ($O_3$) gas.

6. The method of claim 1, wherein the fluid comprises a gas including Nitrogen gas ($N_2$) or Argon.

7. The method of claim 1, wherein the MEMS comprises a spatial light modulator having a reflective surface and the package comprises an optically transparent cover through which the reflective surface is illuminated during operation of the MEMS.

8. A maskless lithography system comprising:
   a fluid source;
   a Micro-Electromechanical System (MEMS) spatial light modulator including a reflective surface and adapted to reflect and modulate a light beam incident thereon;
   a package enclosing the MEMS, the package comprising a cavity in which the MEMS spatial light modulator is enclosed, an optically transparent cover through which the reflective surface is exposed to the light beam, an inlet through which the fluid is introduced to the cavity during exposure of the reflective surface to the light beam, and an outlet through which the fluid is removed from the cavity; and
   a controller to monitor fluid flow through the cavity during exposure of the reflective surface to the light beam, and to stop exposure of the reflective surface to the light beam if the fluid flow drops below a specified minimum,
   wherein the fluid comprises a gas.

9. The system of claim 8, wherein the controller is further configured to monitor pressure of the fluid source.

10. The system of claim 8, further comprising an in-situ monitor to monitor contamination of fluid flowing through the cavity during exposure of the reflective surface to the light beam using, and to stop exposure of the reflective surface to the light beam if the contamination is above a specified level.

11. The system of claim 8, wherein the fluid comprises a reactive gas.

12. A system comprising:
a fluid source;
a Micro-Electromechanical System (MEMS);
a package enclosing the MEMS, the package comprising a cavity in which the MEMS is enclosed, an inlet through which the fluid is introduced to the cavity during operation of the MEMS and an outlet through which the fluid is removed during operation of the MEMS; and
a controller to monitor fluid flow through the cavity during operation of the MEMS, and to stop operation of the MEMS if the fluid flow drops below a specified minimum,
wherein the package includes features that promote laminar flow of the fluid across the MEMS.

13. The system of claim 12, wherein the controller is further configured to monitor pressure of the fluid source.

14. The system of claim 12, further comprising an in-situ monitor to monitor contamination of fluid flowing through the cavity during operation of the MEMS, and to stop operation of the MEMS if the contamination is above a specified level.

15. The system of claim 12, further comprising a filter between the fluid source and the cavity.

16. The system of claim 12, wherein the fluid comprises Nitrogen ($N_2$) or Argon gas.

17. The system of claim 12, wherein the fluid comprises a reactive gas including oxygen ($O_2$) or ozone ($O_3$) gas.

\* \* \* \* \*